United States Patent [19]
Barber et al.

[11] Patent Number: 5,378,989
[45] Date of Patent: Jan. 3, 1995

[54] OPEN GRADIENT COILS FOR MAGNETIC RESONANCE IMAGING

[75] Inventors: William D. Barber, Ballston Lake; Peter B. Roemer, Schenectady; Kenneth W. Rohling, Burnt Hills, all of N.Y.

[73] Assignee: General Electric Company, Schenectady, N.Y.

[21] Appl. No.: 146,346

[22] Filed: Nov. 2, 1993

[51] Int. Cl.⁶ .............................................. G01V 3/00
[52] U.S. Cl. .................................. 324/318; 128/653.5
[58] Field of Search ............. 324/318, 322, 307, 309; 128/653.5; 335/299, 219

[56] References Cited

U.S. PATENT DOCUMENTS

| | | | |
|---|---|---|---|
| 4,646,024 | 2/1987 | Schenck et al. | 324/318 |
| 4,910,462 | 3/1990 | Roemer et al. | 324/322 |
| 4,924,198 | 5/1990 | Laskaris | 335/216 |
| 5,177,442 | 1/1993 | Roemer | 324/322 |
| 5,296,810 | 3/1994 | Morich | 324/318 |
| 5,307,039 | 4/1994 | Chari et al. | 324/318 |

Primary Examiner—Louis Arana
Attorney, Agent, or Firm—Lawrence P. Zale; Marvin Snyder

[57] ABSTRACT

A magnetic field gradient apparatus for use in a magnetic resonance (MR) imaging system employing open magnets allows access to a patient while the patient is being imaged. The magnetic field gradient apparatus employs two gradient coil assemblies and a gradient coil amplifier. Each gradient coil assembly has a gradient coil carrier with at least one gradient coil disposed on it. Each gradient coil carrier is comprised of a cylinder with a flange at one end. The gradient coil assemblies are positioned in the bore of each ring of the open magnet and spaced apart from each other allowing access to the patient. The gradient coil amplifier provides current through the gradient coils to create a magnetic field gradient which has high linearity inside an imaging volume. A coil is disposed on cylinders which surround each gradient coil assembly and fit inside the bore of each ring which acts as an active shield and minimizing eddy currents in conductors outside the gradient coil assemblies.

4 Claims, 11 Drawing Sheets

OPEN GRADIENT COILS FOR MAGNETIC RESONANCE IMAGING

CROSS REFERENCE TO RELATED APPLICATIONS

This application is related to U.S. patent applications "Magnetic Resonance Guided Focussed Ultrasound Surgery" by Harvey Cline et al. Ser. No. 07/854,040 filed Mar. 19, 1992, "Magnetic Resonance Surgery Using Heat Waves Produced with Focussed Ultrasound" by Harvey Cline et al. Ser. No. 07/751,259 filed Aug. 29, 1991; "Magnetic Resonance Surgery Using Heat Waves Produced with a Laser Fiber" by Harvey E. Cline et al. U.S. Pat. No. 4,924,198 "Superconductive Magnetic Resonance Magnet without Cryogens" by Evangelos T. Laskaris issued May 8, 1990; and "MR Imaging System For Minimally Invasive Surgery" by Peter B. Roemer et al.; all assigned to the present assignee and hereby incorporated by reference.

BACKGROUND OF THE INVENTION

1. Field of the Invention

This invention relates to Magnetic Resonance Imaging, and more specifically, a coil for producing a magnetic field gradient for Magnetic Resonance Imaging which allows access to the patient being imaged.

2. Description of Related Art

In Magnetic Resonance (MR) imaging, a patient desired to be imaged is positioned within a main magnet, which produces a static magnetic field, and near by radiofrequency coils and magnetic gradient coils. The gradient coils are energized to produce magnetic fields through interaction with a static magnetic field produced by a main magnet. Radiofrequency (RF) excitation pulses are applied to the RF coils to radiate RF energy through the patient, nutating resonating nuclei "nuclear spins". These nutated nuclear spins produce a spatial position encoded MR response signal when proper magnetic field gradients are applied to them.

Typically, to produce a homogeneous magnetic field over the patient, the main magnet has a cylindrical shape which surrounds the patient, preserving radial symmetry. The gradient coils are also cylindrically shaped and fit inside the main magnetic and also surround the patient. U.S. Pat. No. 4,646,024, "Transverse Gradient Field Coils for Nuclear Magnetic Resonance Imaging" issued Feb. 24, 1987 to Schenck, J. F., Hussain, M. A., Edelstein, W. A., and assigned to the instant assignee, describes the design of whole body gradient coils. Access to the patient is, therefore, severely limited due to the geometry of the main magnet in gradient coils.

Since MR imaging provides high resolution images of various types of soft tissue, and may more readily differentiate tissue types, it would be beneficial to a surgeon to have a "snapshot" or "movie" of internal structures of the patient during surgery. This may assist the surgeon in his procedures.

In addition to limited access, patients typically develop a claustrophobic reaction during imaging.

Therefore, an open MR imaging system employing open gradient coils is needed which would allow a maximum access to the patient allowing medical procedures to be performed on a patient while still providing high resolution images of the patient. In addition, an open MR imaging system would reduce the claustrophobic reaction of the patients.

SUMMARY OF THE INVENTION

A gradient coil set for providing a magnetic field gradient in an open magnet magnetic resonance (MR) imaging system for imaging a patient has two coil assemblies and a gradient coil amplifier. Each coil assembly fitting into a bore of the open magnet and spaced apart from each other with the flange ends toward each other defining an open imaging region between the flanges allowing access to said patient. Each coil assembly having a pair of gradient coil carriers constructed of a cylinder with at least one open end, and a flange attached to an end. The current-carrying continuous paths being partially disposed on the cylinder and the flange so as to produce a magnetic field gradient within the imaging volume without obstructing access into the volume. The gradient coil amplifier energizes the current-carrying continuous paths by passing an electrical current through the paths creating a spatially-changing linear magnetic field gradient to allow MR imaging of said patient.

OBJECTS OF THE INVENTION

It is an object of the invention to provide magnetic field gradients for magnetic resonance (MR) imaging which is highly linear over a region of a patient being imaged while providing maximum access to the patient.

Another object of the present invention is to provide a gradient coil set which is contained within an open magnet of an MR imaging system for producing linear magnetic field gradients for high resolution images without obstructing access to the patient.

Another object of the present invention is to provide an apparatus for MR imaging providing open regions within the magnet, thereby limiting claustrophobic reactions by a patient being imaged.

Another object of the present invention is to provide a shielded gradient coil set which fits within an open magnet which limit eddy currents within the main magnet.

BRIEF DESCRIPTION Of THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIG. 8 is a representation of magnetic field intensity in the "X", "Y" plane of the gradient coil of FIG. 5a.

FIG. 9 is a representation of magnetic field intensity in the "X", "Z" plane of the gradient coil of FIG. 5a.

DETAILED DESCRIPTION OF THE INVENTION

Figure 1:
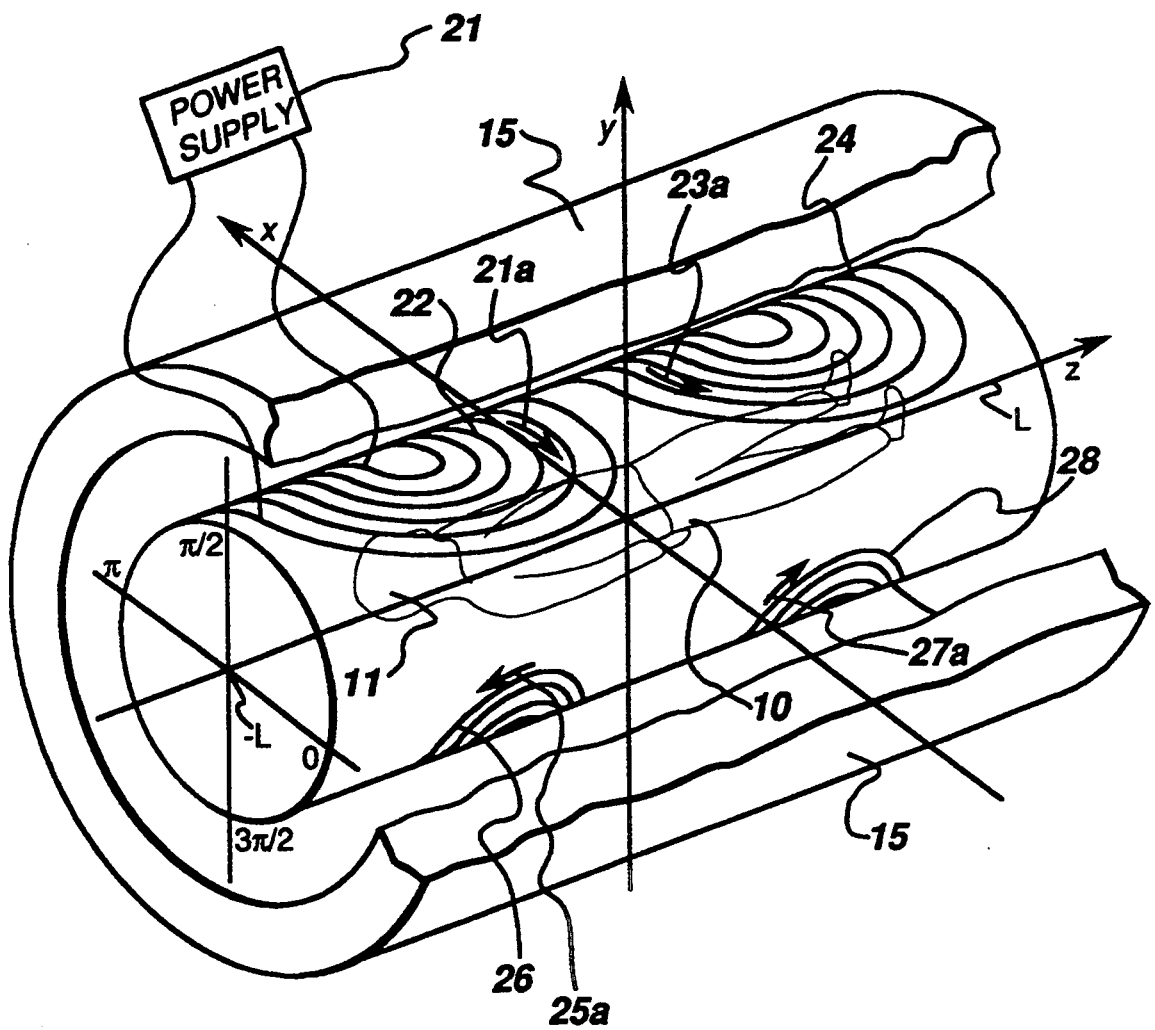
FIG. 1 is a schematic illustration of a partial magnetic resonance imaging system illustrating a conventional whole-body gradient coil assembly.

FIG. 1 is a schematic diagram of a portion of the apparatus used in conventional MR imaging. A magnet 15, usually a super-conducting magnet, surrounds the entire apparatus. A body coil assembly portion 20 is shown as it would be implemented inside the magnet 15. The body coil assembly portion 20 is comprised of four gradient coils, which resemble a fingerprint, called fingerprint coils 22, 24, 26 and 28. The centers of the fingerprint coils 22 and 26 are located on opposite sides of the body coil assembly such that a line passing through the centers of fingerprint coils 22 and 26 would also pass through the center of body coil assembly portion 20. Similarly, fingerprint coils 24 and 28 are positioned on opposite sides of body coil assembly portion 20 such that a line passing through their centers would also pass through the center of body coil assembly assembly portion 20. Current is passed through the fingerprint coils by a power supply 21. Power supply 21 provides a current which passes through fingerprint coil 22 in a direction marked by arrow 21a. Similarly, power supply 21 supplies current which passes through fingerprint coils 24, 26 and 28 in the direction marked by arrows 23a, 25a and 27a, respectively.

Due to its geometry, access to the patient is limited only to openings at either end of the whole body gradient coil set.

In order to provide greater access to the patient during imaging, and to reduce the claustrophobic reaction, open magnets have been recently introduced as described in U.S. patent application U.S. Pat. No. 4,924,198 "Superconductive Magnetic Resonance Magnet without Cryogens" by Evangelos T. Laskaris issued May 8, 1990, assigned to the present assignee and hereby incorporated by reference. This magnet is comprised of two superconducting rings spaced apart from each other, both sharing the axis same axis. The spacing between the rings is substantially that determined by a "Helmholtz pair". A patient intended to be imaged is positioned such that the region to be imaged is in the most homogeneous magnetic portion of the field, between the rings, known as the imaging volume.

Since most conventional gradient coil designs require a major portion of their current carrying conductors to be near the central region, the use of conventional gradient coils would obstruct the open area provided by the open magnet, thereby defeat the purpose of the open magnet.

The present invention provides magnetic field gradients used to produce fast, high-quality images of a region of a patient in an open access magnet, while providing the greatest access to the patient.

In order to provide maximum access to the patient, carriers on which the gradient coils would be disposed, were restricted to fit within regions within the bores of the tings of the open magnet. Classical potential theory requires the current surface be as close to the desired useful volume as possible and subtend as large a solid angle as possible for greatest efficiency.

In order to actively cancel eddy currents in a most efficient way, the shield coils must be positioned as near as possible to the surface where cancellation is desired. The shield coil should also have a current density distribution as similar to that induced on a nearby conductor to provide eddy current cancellation.

There was an additional requirement of maintaining as great a symmetry as possible.

Several gradient coil carrier designs complying with these constraints were modeled with different flange angles, coil separations, coil diameters, and coil form lengths.

Figure 2:
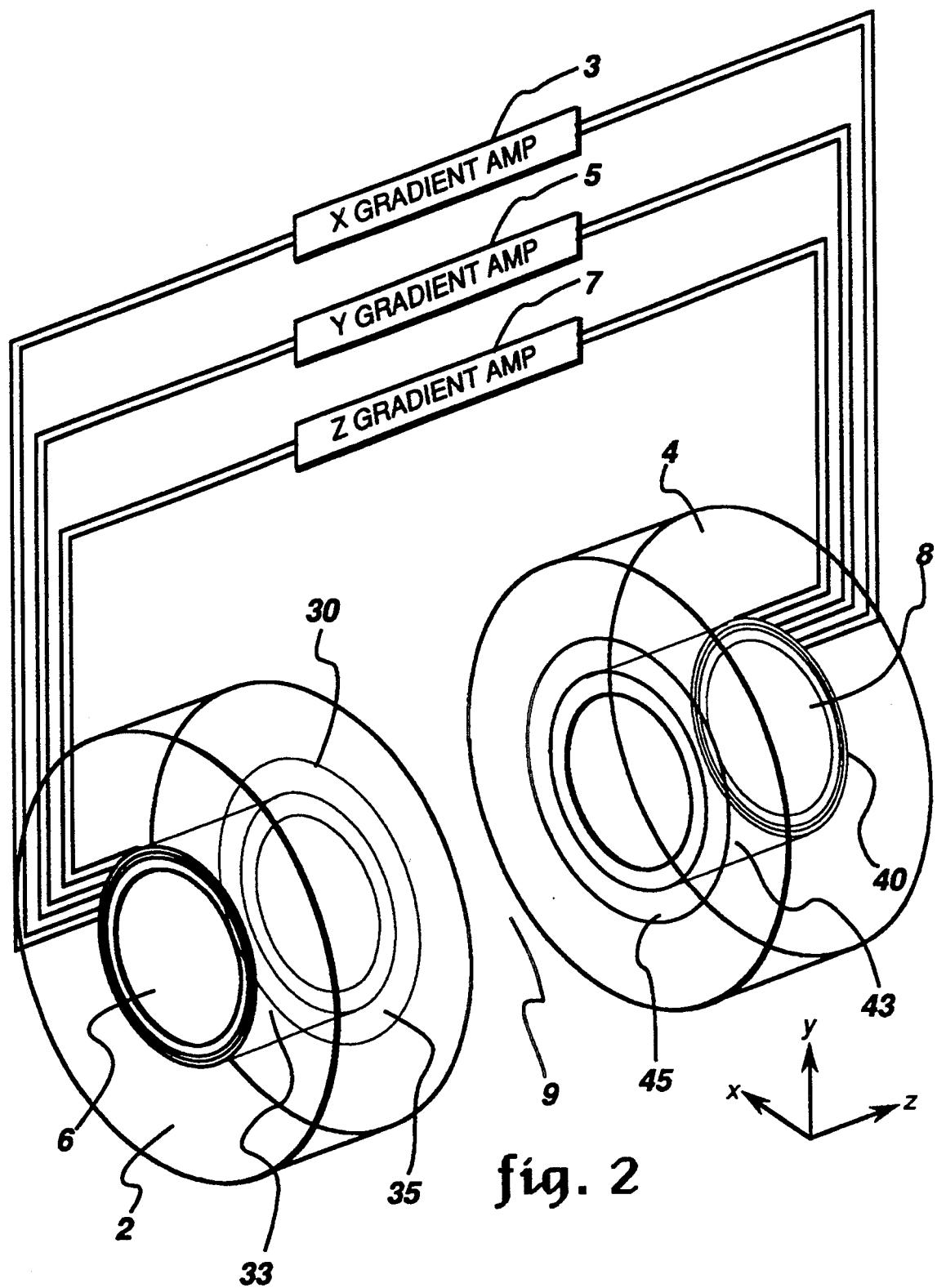
FIG. 2 is a perspective illustration of an open magnet with the gradient coils according to the present invention installed in the bores of the open magnet.

In FIG. 2, the main magnet is an open magnet having two rings 2, 4, each containing one or more circular superconducting coils. Access to the patient is allowed between the tings in an open region 9 where a substantially uniform magnetic field is produced midway between the tings. The magnetic field gradient, in the X or Y directions, or for that matter, any direction perpendicular to the axis of the tings (the Z direction), is produced by two coils on one gradient coil carrier 30 and two coils on a second gradient coil carrier 40. Gradient coil carriers 30, 40 each are comprised of a cylinder 33, 43 connected to a flange 35, 45 with two coils, each partially disposed on the cylinder and the flange. An opening 6, 8 in the center of each carrier 30, 40 may receive the patient being imaged, or the patient may be positioned between the two rings 2 and 4 such the the region being imaged is placed within imaging volume 9.

In one embodiment, the flange 35, 45 of carrier 30, 40 is disk-shaped and connected such that the surface of cylinder 33, 43 is perpendicular to the face of flange 35, 45, respectively. In an alternative embodiment, the flange 35, 45 may attached at an angle to cylinder 33, 43. In still another embodiment, the flange may be simply a flared end of cylinder 33, 43. In the preferred embodiment, gradient carriers 30, 40 were positioned in the bore of each ring of the main magnet and set back slightly (⅛ inch) from the main magnet face to provide greater access.

In order to produce the required gradients over imaging volume 9 for MR imaging, several sets of gradient coils must be constructed. At least one set produces a magnetic field gradient in a "Z" direction along the length of the carrier cylinder. At least one other gradient coil set produces gradients in directions perpendicular to the carrier cylinder axis. These may be in the "X" and "Y" directions. Current is driven through the "X", "Y", and "Z" gradient coil sets by gradient coil amplifiers 3, 5, and 7.

Figure 3:
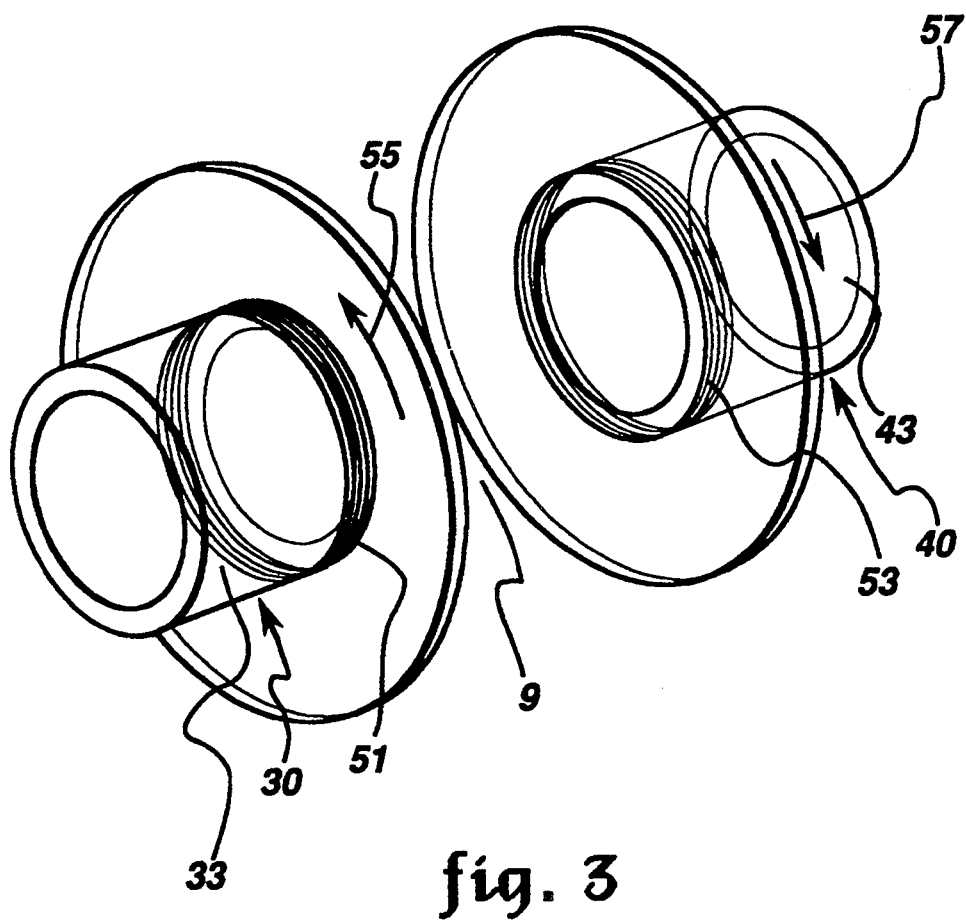
FIG. 3 is an illustration of gradient coil set which produce a magnetic field gradient in a "Z" direction mounted on the gradient coil carriers.

In FIG. 3, the "Z" gradient coil set is simply a number of circular turns of a coils 51, 53 around cylinders 33, 43 of each gradient coil carrier in a "ring" shape and positioned as close as possible to imaging volume 9. The current flows in opposite directions as shown by arrows 55, 57 to produce a "Z" magnetic field gradient. In an alternative embodiment, the "Z" gradient coils may be disposed on the flange section of gradient coil carriers 30, 40.

For gradients in directions perpendicular to the "Z" axis, such as an "X" ,gradient or "Y" gradient, the coil paths, (current distribution) were computed by determining what the desired gradient magnetic field should be over the imaging volume. The desired magnetic field was expanded into spherical harmonics. Then, applying the constraint of a magnetic field of zero magnitude outside of the shield coil, the current distributions was optimization as to maximize magnetic field gradient linearity, and minimize current required.

Figure 4A:
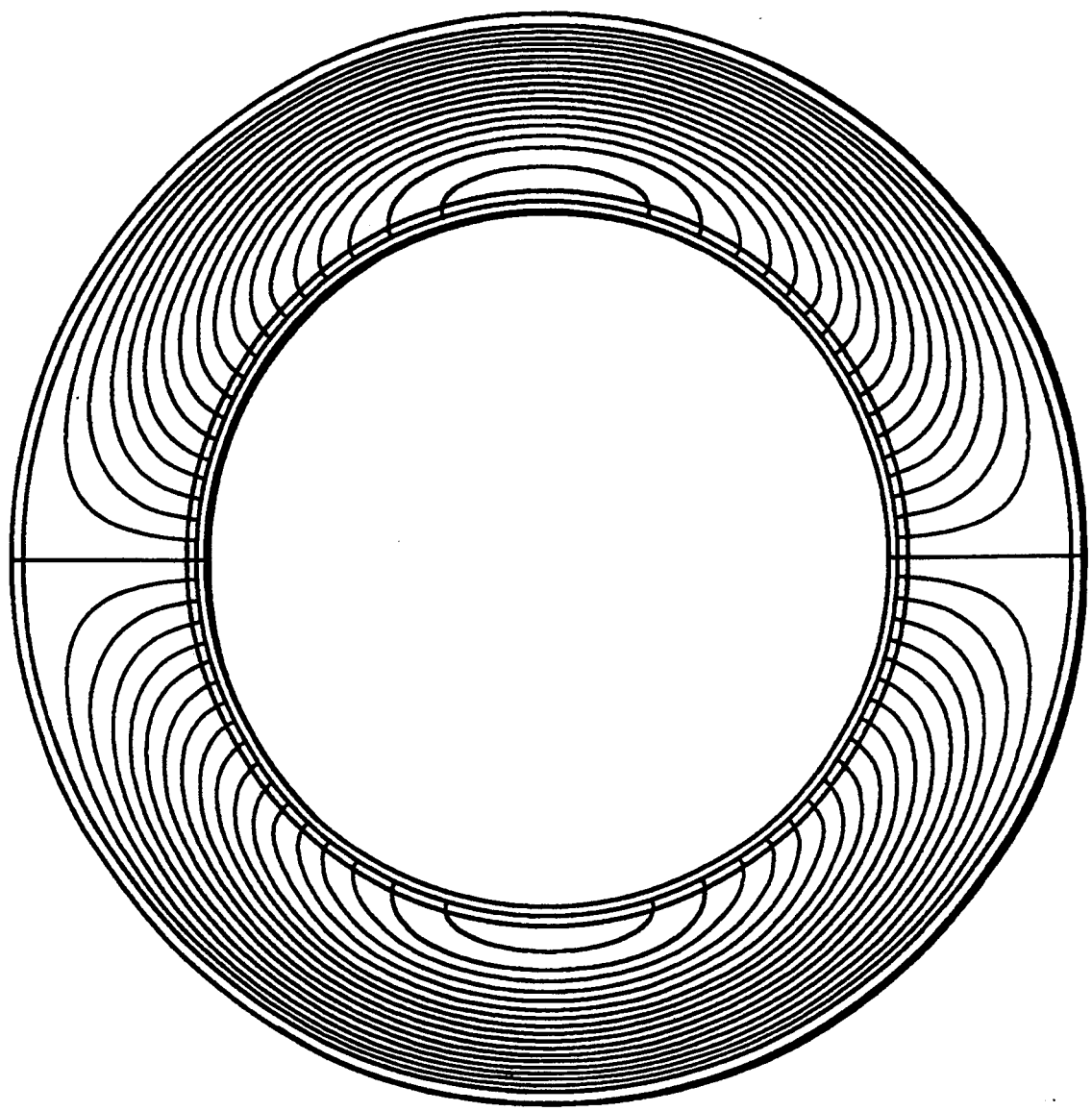
FIG. 4a is an etching pattern for a current path to be disposed on the flanges of the gradient coil carrier according to the present invention.
Figure 4B:
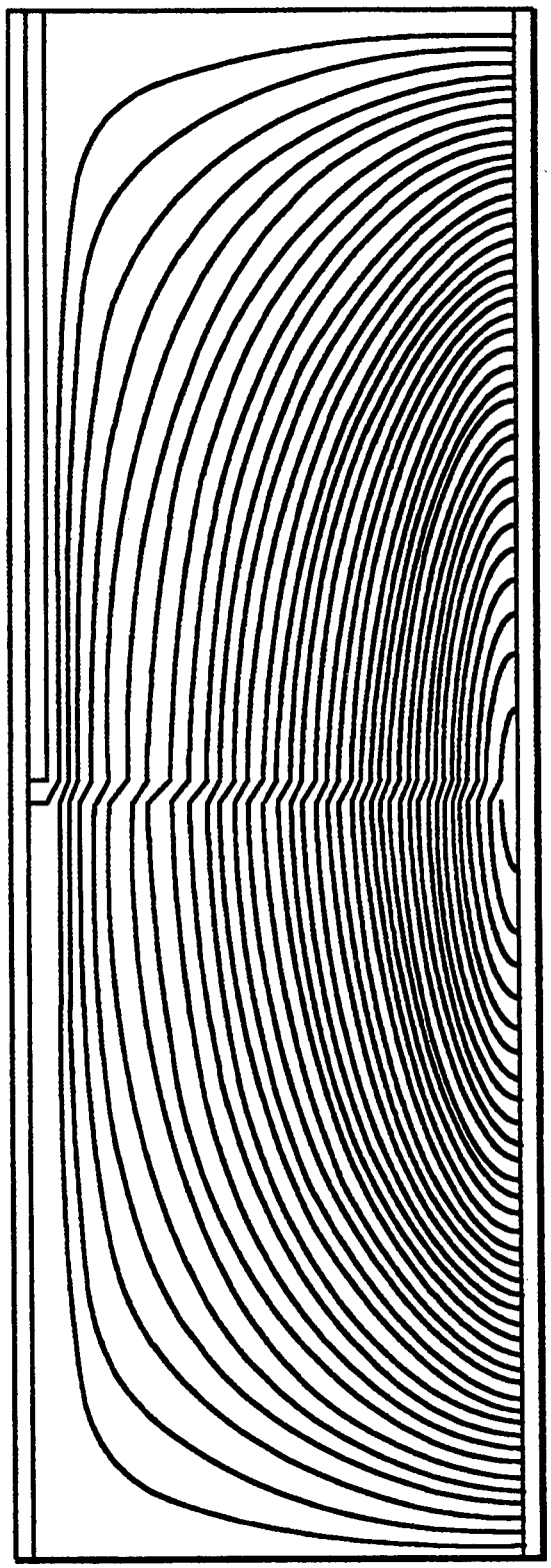
FIG. 4b is an etching pattern for the current paths to be positioned around both sides of cylinders of the gradient coil carriers according to the present invention.
Figure 4C:
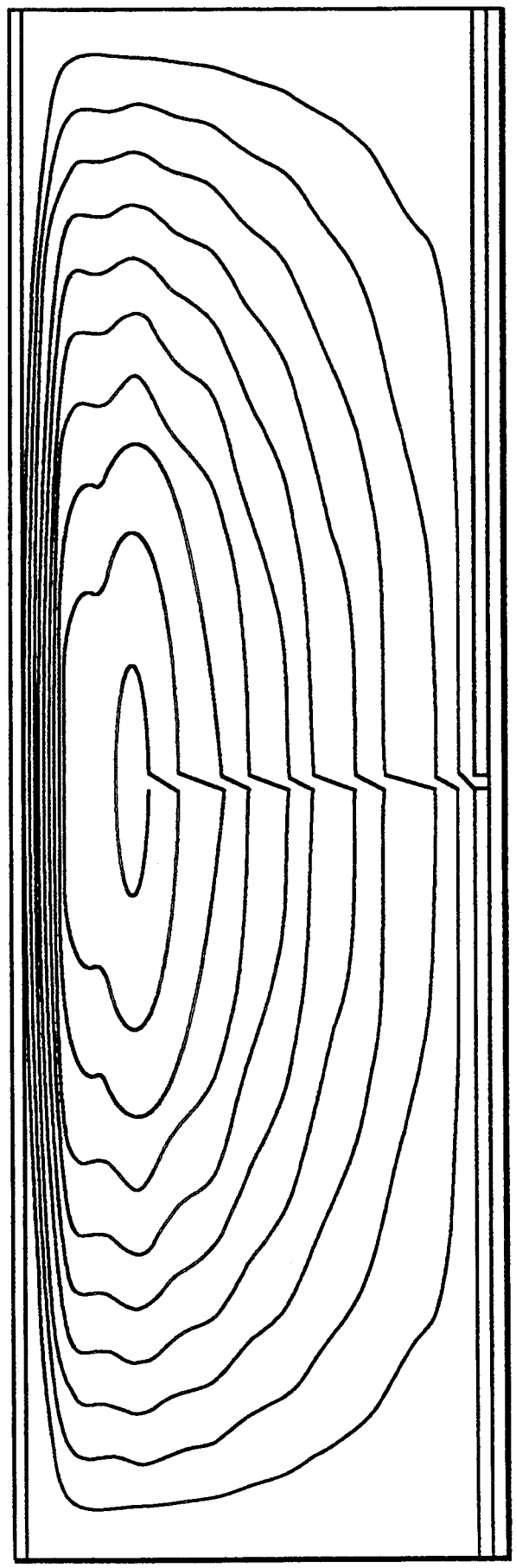
FIG. 4c is an etching pattern for the current paths to for a shield coil to be disposed on the shield coil carrier.

The resulting coil paths are shown in FIGS. 4a, 4b and 4c. FIG. 4a is the etching pattern of the current path to be disposed on flanges 35, 45 of FIG. 2. FIG. 4b represents the current path which is etched to create two sets of partial current paths 37b, 39b, 47b, 49b and positioned around both sides of cylinders 33, 43 of FIG. 2. FIG. 4c is the current path to be etched as the shield coil and disposed on the shield coil carrier.

Figure 5A:
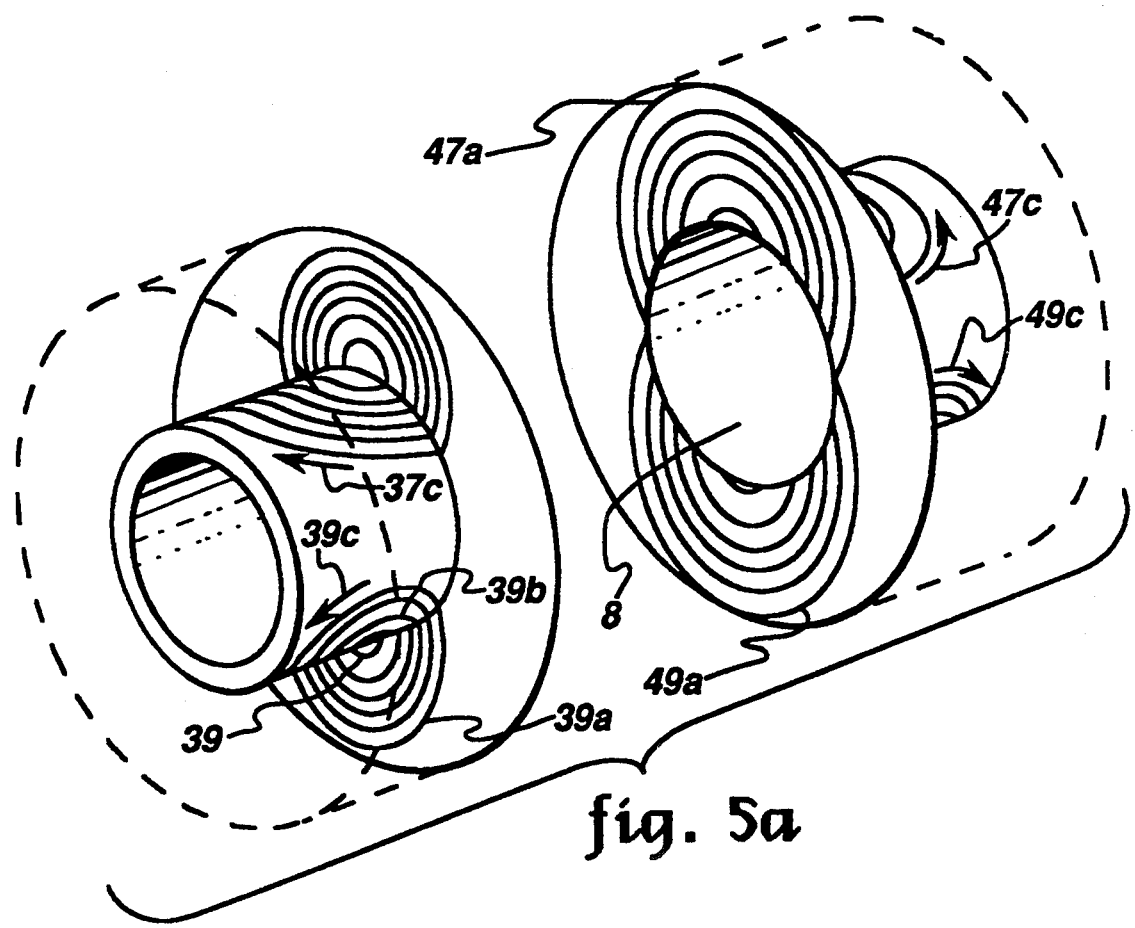
FIG. 5a is a perspective view of current paths to produce a gradient perpendicular to the "Z" axis disposed on gradient coil carriers.

FIG. 5a is a perspective view of current paths to produce a gradient perpendicular to the "Z" axis disposed on gradient coil carriers 30, 40. A coil 37 is disposed on one side of carrier 30 with a second coil 39 disposed on the other side such that a line passing through the center of the coils would pass through opening 6. Coils 37, 39 are comprised of a plurality of turns, each turn partially disposed on the cylinder, denoted by 37a, 39a, and partially disposed on the flange, 37b, 39b. Similarly, two coils 47, 49 are disposed opposite each other on carrier 40. Each coil having a portion 47a, 49a disposed on the flange and a portion 47b, 49b disposed on the cylinder. The current flow to produce a magnetic field gradient in a direction perpendicular to the "Z" direction is shown by arrows 37c, 39c, 47c, 49c, for coils 37, 39, 47, 49, respectively.

If coils 37, 39, 47, 49 are positioned such that the "X" axis passes through their centers, they will produce a magnetic field gradient in the "X" direction. In order to produce a gradient in the "Y" direction, another set of coils, the same as the first set, should be disposed on the gradient coil carriers rotated at a 90 degree angle relative to the first set of gradient coils.

Figure 5B:
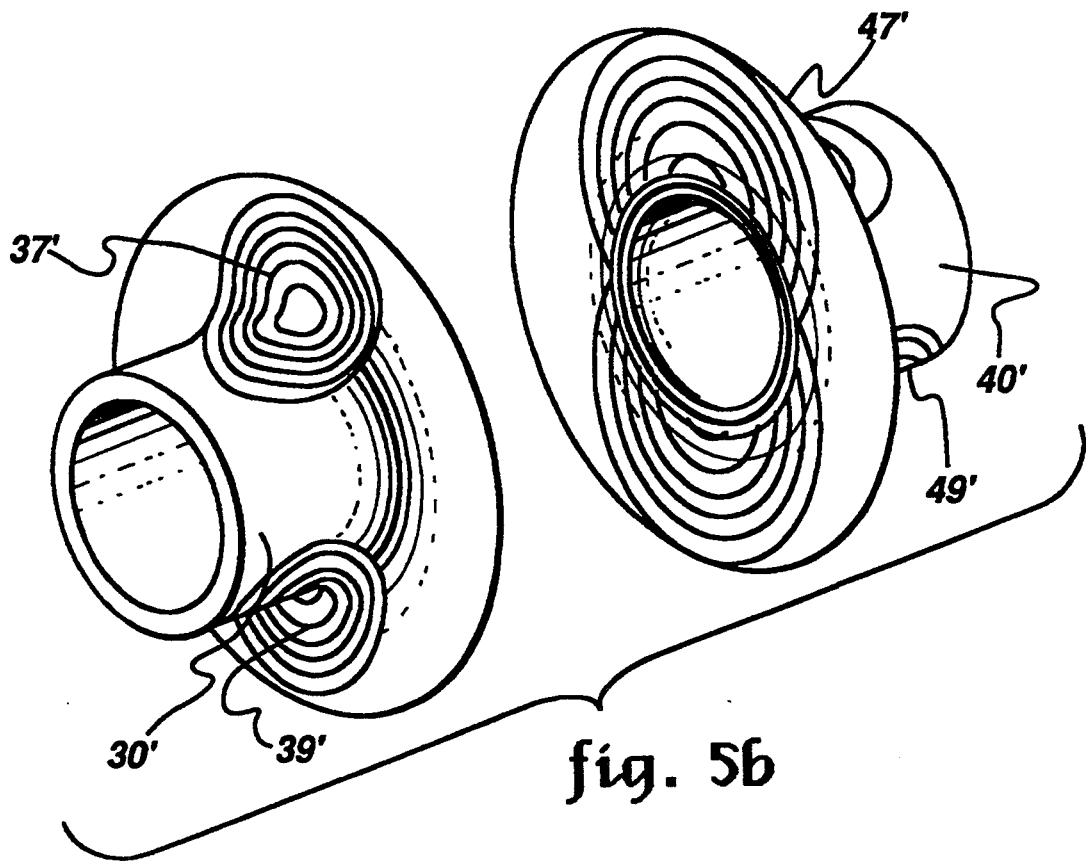
FIG. 5b is an alternative embodiment of the gradient coil and gradient carrier coil shape.

FIG. 5b is an alternative embodiment of the gradient coil and gradient carrier coil shape. Here gradient coil carrier 30', 40' have a flange which is simply a flair of the cylindrical body. Gradient coils 37', 39', 47', 49' are disposed on gradient coil carriers 30', 40' to produce a gradient in a direction perpendicular to the "Z" axis.

The process of optimizing the gradient coil current paths for a three dimensional gradient coil carrier shape can be summarized in the following steps:

1. defining a desired magnetic field distribution;
2. defining boundary conditions for a two dimensional surface;
3. assuming an arbitrary set of predefined current distributions to exist on the two dimensional surface;
4. defining a coordinate transform which maps this two dimensional surface onto the three dimensional physical surface of the gradient coil carrier, the coordinate transform also defining the mapping of the current density distributions to the gradient coil carrier;
5. computing the vector magnetic field produced by these transformed current distributions using the Biot-Savart law to result in a collection of known magnetic vector fields which are produced by the predefined set of current distributions;
6. calculating the deviation of the magnitude of the current distribution in each element of the two dimensional surface which is required to produce the desired magnetic field; and
7. if deviations calculated are unacceptable, adjusting the predefined set of current distributions and iteratively repeating steps "1" through "6".

The gradient coil were constructed etched copper (printed circuit board) conductors for the X- and Y-gradient coils but discrete conductors for the Z-gradient coils since the number of Z-coil turns was small. One could have just as easily used discrete conductors for all the coils.

The flange portion of the etch coils were made from the pattern of FIG. 4a and positioned on a circular disk. The multiple internal connections between the flange and disk were fabricated by soldering tabs to form the joints. The conductor density on the flange was greater than that of the cylinder. To reduce the current density and heating, the flange was made by using two separate but identical conductor (circuit) boards and then making the solder connection in a staggered or alternating fashion such that the two the two sets of flange conductors had the proper series connection.

An alternate method of fabrication of the cylinder-flange current distribution would have been to predetermine a distorted pattern, wind the coils on a mandrel, and the bend one end of the coil to form the proper flange current pattern.

Figure 6:
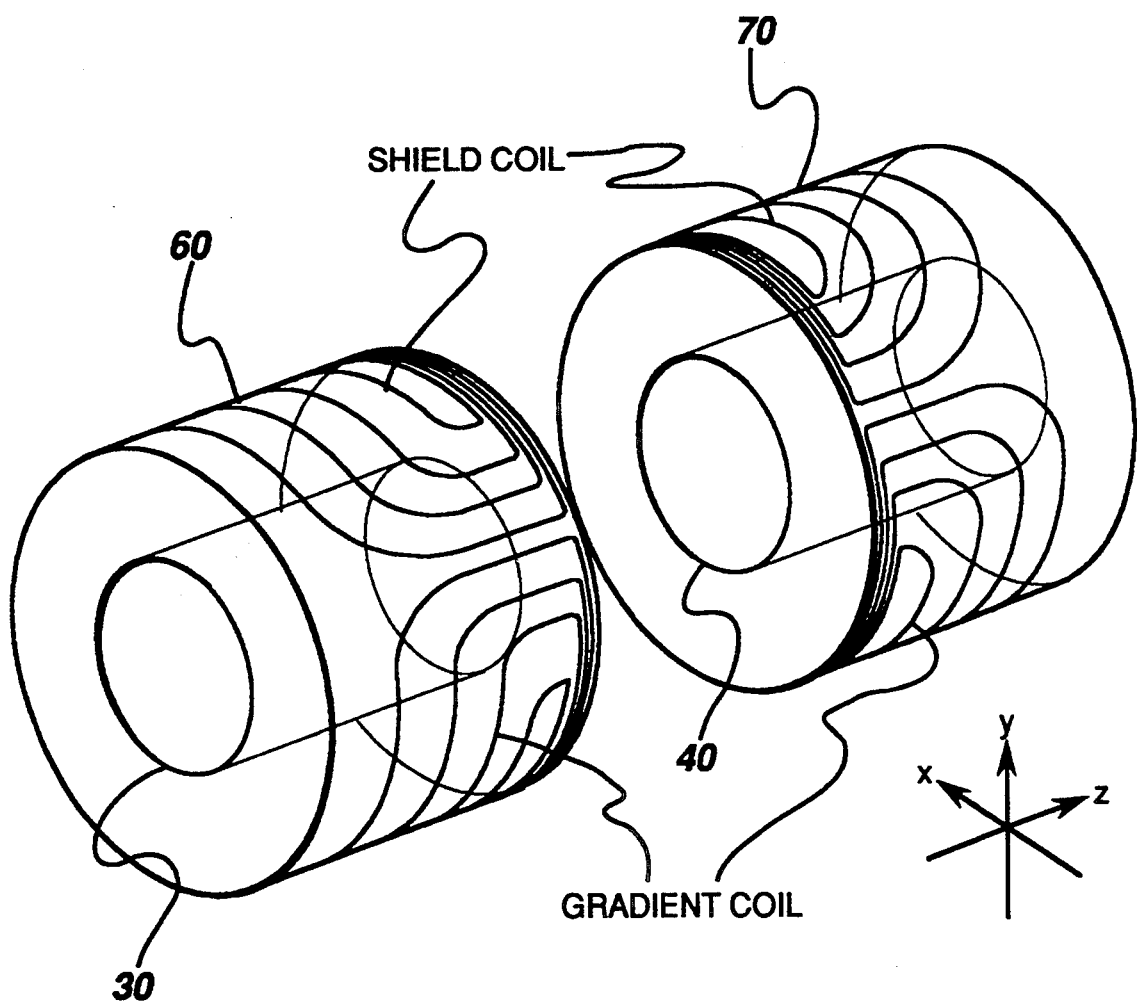
FIG. 6 is a perspective view of the gradient coil and gradient carrier coil with an active shield coil.

In order to minimize the eddy currents produced in nearby conductors, active shield coils are distributed onto the surface of a shield coil carrier 60, 70 as shown in FIG. 6, which fit inside the bore of main magnet rings 2, 4. The shield coils are each serially connected to respective gradient coils on carriers 30, 40, respectively.

Figure 7:
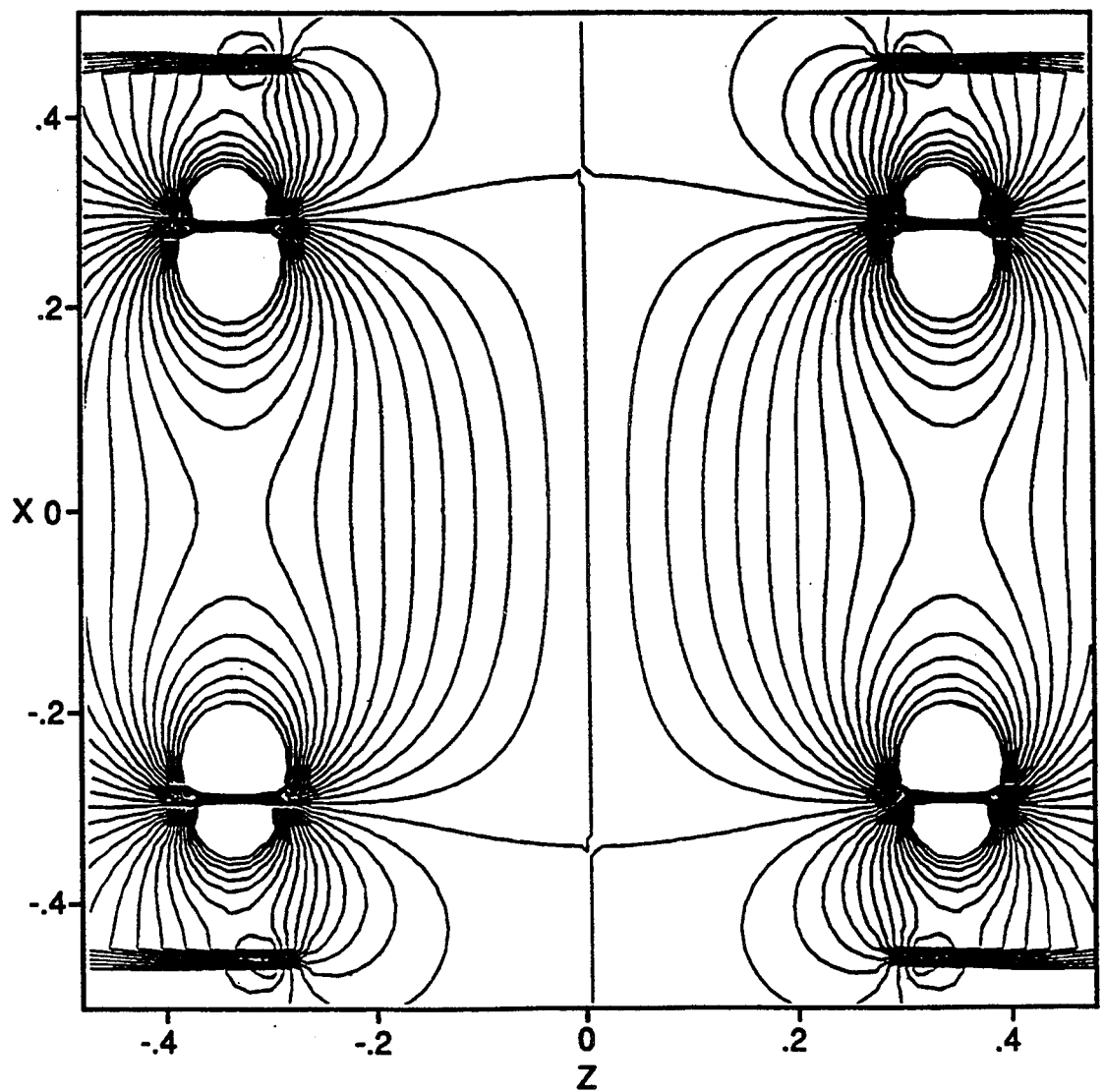
FIG. 7 is a graphic representation of magnetic field intensity in the the "X", "Z" plane of the "Z" gradient coil of FIG. 3.

Experimental results of the "Z" gradient coil of FIG. 3 are shown in FIG. 7. Each line represents equal magnetic field intensity over the "X", "Z" plane graduated by 4 Gauss units.

Figure 8:
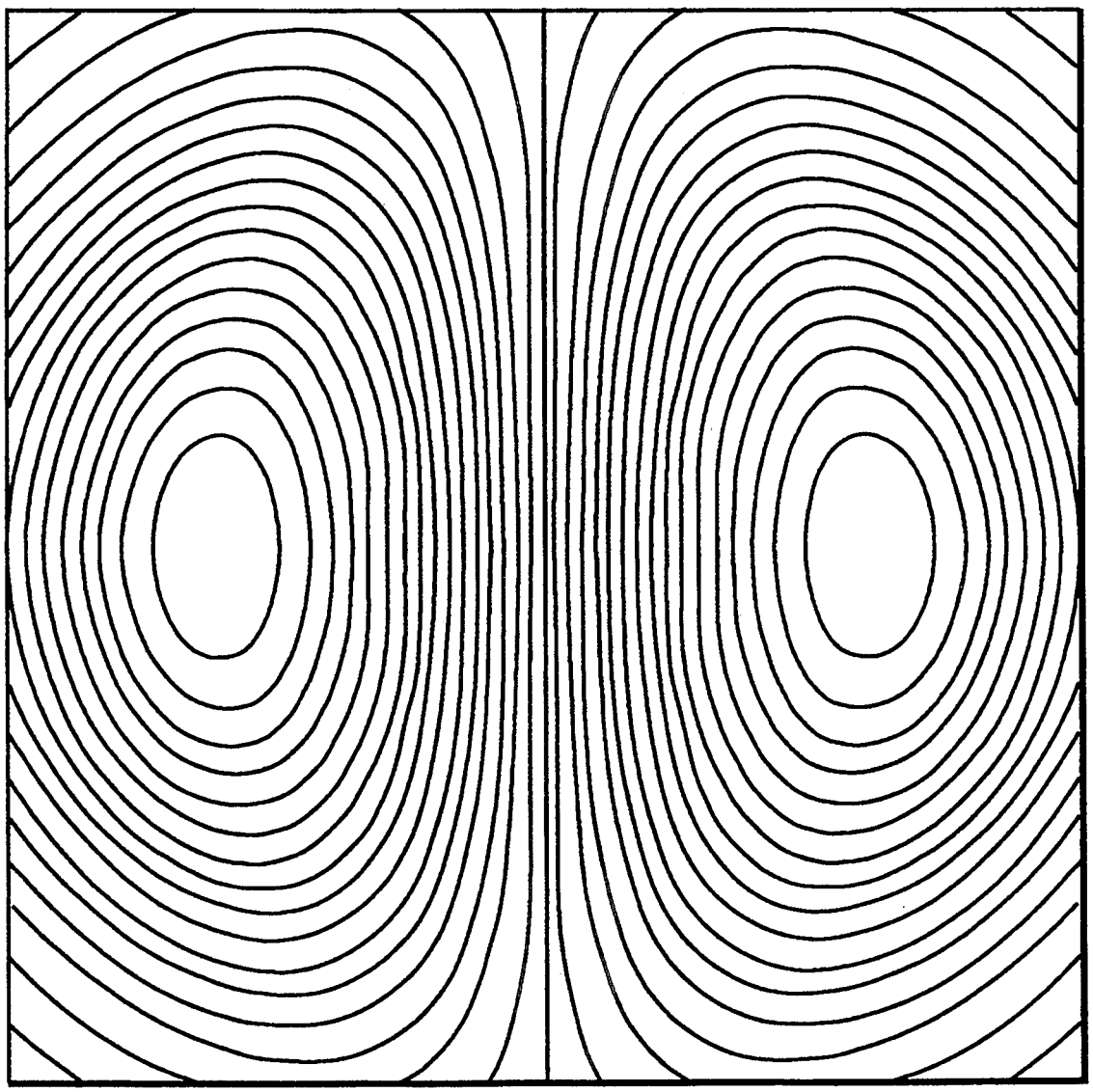

FIG. 8 is a representation of magnetic field strength in the "X", "Y" plane when the coil of FIG. 5a is energized.

Figure 9:
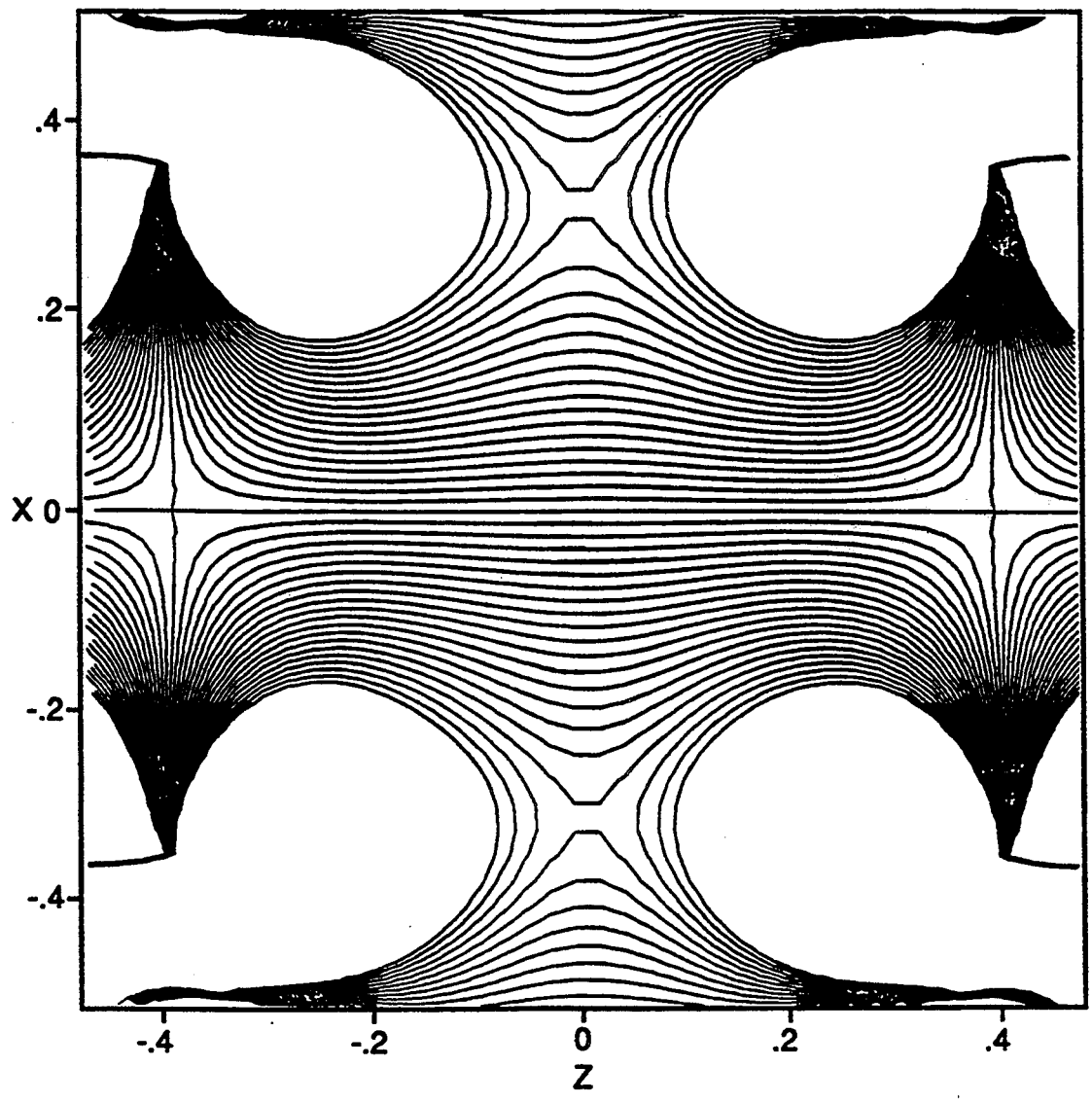

FIG. 9 is a representation of magnetic field strength in the "X", "Z" plane when the coil of FIG. 5a is energized.

The gradient coil set according to the present invention has been demonstrated to be the functional when employed in a conventional cylindrical main magnet. This becomes important when imaging a patient's. When imaging a patient's head, he is positioned with his head in the center of the main magnet lengthwise, where the imaging volume is. Due to the enclosed nature of the closed magnet and further enclosed by the closed gradient coils, the patients tend to have claustrophobic reactions. Since the present invention does not surround the imaging volume, there is additional clearance in the center of the main magnet reducing the patient's reaction.

While several presently preferred embodiments of the novel spectroscopic imaging system have been described in detail herein, many modifications and variations will now become apparent to those skilled in the art. It is, therefore, to be understood that the appended claims are intended to cover all such modifications and variations as fall within the true spirit of the invention.

What is claimed is:

1. A gradient coil set for an open magnet magnetic resonance (MR) imaging system for imaging a patient, comprising:

a) at least one pair of coil assemblies, each coil assembly comprising:

i. a pair of gradient coil carrier having a cylinder having at least one open end and having a flange attached to one end, the carriers fitting into a bore of the open magnet spaced apart from each other with the flange ends toward each other defining an open imaging region between the flanges allowing access to said patient, ii. at least two current-carrying continuous paths, each path having a plurality of turns, with each turn being partially disposed on the cylinder and the flange; and b) a gradient coil amplifier for energizing the current-carrying continuous paths with an electrical current, creating a spatially-changing linear magnetic field gradient to allow MR imaging of said patient.

2. The gradient coil set of claim 1 further comprising a shielding coil, surrounding each coil assembly and fitting within the open magnet bore for creating a magnetic field opposite that created by the gradient coil so as to null out the magnetic field effects created by the gradient coil set outside of the gradient coil.

3. The gradient coil set of claim 1 wherein the flange is disk-shaped having an opening in it which is substantially the diameter of the cylinder of the gradient coil carrier.

4. The gradient coil set of claim 1 wherein the flange is a flared extension of the cylinder of the gradient coil carrier.

* * * * *